US011333340B1

(12) United States Patent
Lin et al.

(10) Patent No.: US 11,333,340 B1
(45) Date of Patent: May 17, 2022

(54) TOUCH CONTROLLER FOR LED LIGHT STRING OR LIGHT STRIP

(71) Applicant: Changzhou Jutai Electronic Co., Ltd., Jiangsu (CN)

(72) Inventors: Jun Lin, Jiangsu (CN); Wei Huang, Jiangsu (CN); Chengqian Pan, Jiangsu (CN); Bin Chen, Jiangsu (CN)

(73) Assignee: CHANGZHOU JUTAI ELECTRONIC CO., LTD., Changzhou (CN)

( * ) Notice: Subject to any disclaimer, the term of this patent is extended or adjusted under 35 U.S.C. 154(b) by 0 days.

(21) Appl. No.: 16/989,922

(22) Filed: Aug. 11, 2020

(51) Int. Cl.
| | |
|---|---|
| *F21V 23/00* | (2015.01) |
| *F21V 23/04* | (2006.01) |
| *G06F 3/041* | (2006.01) |
| *F21V 31/00* | (2006.01) |
| *F21Y 115/10* | (2016.01) |
| *G06F 3/044* | (2006.01) |

(52) U.S. Cl.
CPC ........ *F21V 23/0485* (2013.01); *F21V 31/005* (2013.01); *G06F 3/0416* (2013.01); *F21V 23/004* (2013.01); *F21Y 2115/10* (2016.08); *G06F 3/044* (2013.01)

(58) Field of Classification Search
CPC ...... F21V 23/00; F21V 23/003; F21V 23/004; F21V 23/0485; H03K 17/962; G06F 3/0416; G06F 3/044
See application file for complete search history.

(56) References Cited

U.S. PATENT DOCUMENTS

| | | | |
|---|---|---|---|
| 8,674,986 B2* | 3/2014 | Bin Zafar | G06T 15/506 345/426 |
| 2003/0160518 A1* | 8/2003 | Chang | H03K 17/962 307/147 |
| 2017/0311407 A1* | 10/2017 | Chen | H05B 47/19 |
| 2020/0133431 A1* | 4/2020 | Allore | G06F 3/03547 |

* cited by examiner

*Primary Examiner* — Thai Pham
(74) *Attorney, Agent, or Firm* — Dragon Sun Law Firm, PC; Jinggao Li, Esq.

(57) ABSTRACT

A touch controller for an LED light string or light strip is disclosed. The touch controller includes a housing, an end cover connected with the housing, a liquid-sealed accommodating cavity being defined between the end cover and the housing, a printed circuit board positioned in the accommodating cavity, a light-emitting control circuit being arranged on the printed circuit board, a touch input unit positioned in the accommodating cavity, the touch input unit being electrically connected with the light-emitting control circuit, one part of the touch input unit being matched with the housing or the end cover, and when a touch behavior is applied to the part, matched with the touch input unit, of the housing or the end cover, a trigger signal is provided for the light-emitting control circuit through the touch input unit.

17 Claims, 29 Drawing Sheets

TOUCH CONTROLLER FOR LED LIGHT STRING OR LIGHT STRIP

CROSS REFERENCE

This application claims the priority benefit of Chinese Patent Application No. CN2020215059526, filed on Jul. 27, 2020, which is hereby incorporated by reference in its entirety.

TECHNICAL FIELD

The disclosure pertains to the technical field of LED lights, and specifically pertains to a touch controller for an LED light string or light strip.

BACKGROUND

An LED light string or light strip is usually connected with a power controller, an existing power controller comprises a housing, an end cover, a printed circuit board and a key switch, at least one part of the printed circuit board is positioned in the housing, a direct-current output circuit and a light-emitting control circuit are arranged on the printed circuit board, the end cover is fixed to the housing, an assembly hole is formed in the end cover, one end of the key switch is connected with the circuit board, the other end of the key switch is matched with the assembly hole, and the LED light string or light strip is usually used outdoors, so that a silica gel sleeve is usually installed in the assembly hole to seal a gap between the assembly hole and the key switch, and a waterproof purpose is achieved. In use, a trigger signal is provided for the light-emitting control circuit by pressing the key switch, and the light-emitting control circuit outputs a control instruction for changing a light-emitting mode according to the trigger signal and a program preset in the light-emitting control circuit, so that different light-emitting effects are achieved.

The structure has a good waterproof effect in the initial stage, but along with the increase of service time, on one hand, as the space defined by the housing and the end cover is closed, a part of heat emitted by electronic parts and components on the circuit board can act on the silica gel sleeve, the silica gel sleeve can be gradually hardened, and the sealing performance is gradually reduced; on the other hand, in use, acting force generated by a finger is transmitted to the key switch through the silicon rubber sleeve, so that the silica gel sleeve is stressed to deform in the pressing process, a gap is formed between the silica gel sleeve and the end cover, liquid existing on the end cover enters the housing along the gap, and adverse effects such as short circuit and the like are caused to a circuit on the circuit board; and the structure is complex in manufacturing process and high in cost.

SUMMARY

The disclosure provides a touch controller for an LED light string or light strip, which is good in waterproof effect and convenient to operate.

A touch controller for an LED light string or light strip, comprising:

a housing;

an end cover, after the end cover is connected with the housing, a liquid-sealed accommodating cavity being defined between the end cover and the housing;

a printed circuit board positioned in the accommodating cavity, a light-emitting control circuit being arranged on the printed circuit board; and characterized by further comprising a touch input unit positioned in the accommodating cavity, the touch input unit being electrically connected with the light-emitting control circuit, one part of the touch input unit being matched with the housing or the end cover, and when a touch behavior is applied to the part, matched with the touch input unit, of the housing or the end cover, a trigger signal is provided for the light-emitting control circuit through the touch input unit.

According to the disclosure, entity keys in the prior art are cancelled, and a touch input unit is used for providing a trigger signal for a light-emitting control circuit, so that the advantage is that the touch input unit can generate the trigger signal as long as electric parameters are changed by touch, in this way, the touch input unit can be integrally packaged in an accommodating cavity defined by a housing and an end cover, so that through holes do not need to be formed in the housing and the end cover to install the touch input unit, therefore, guarantees are provided for realizing absolute waterproofness, the light-emitting effect is changed in a touch mode, and the advantage of convenience in use is achieved.

DESCRIPTION OF THE EMBODIMENTS

Figure 1:
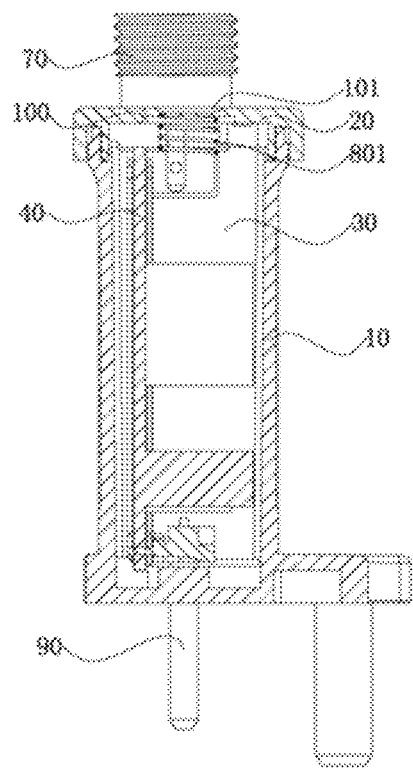
FIG. 1 is a profile of a touch controller.
Figure 2:
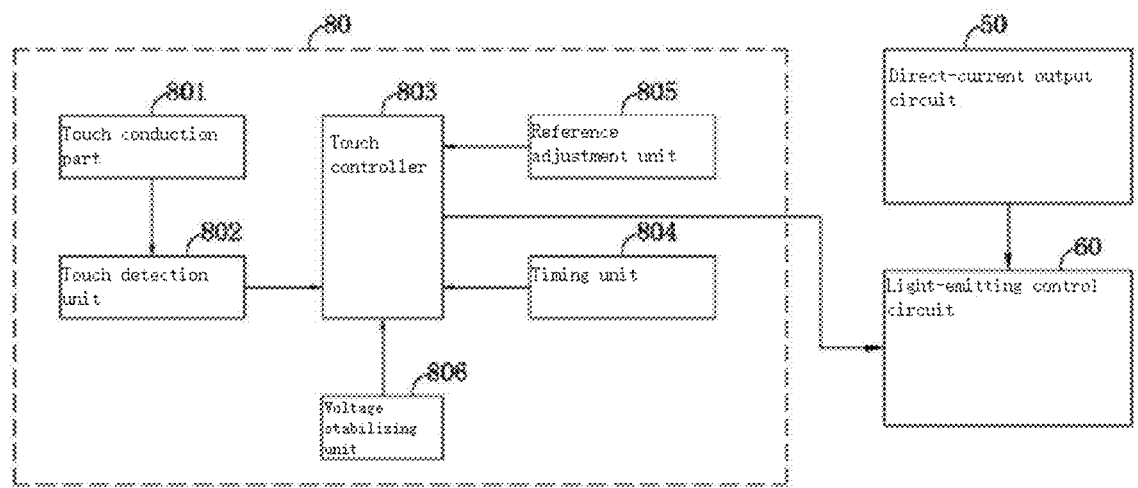
FIG. 2 is a circuit block diagram of a touch input unit.

As shown in FIG. 1 and FIG. 2, a touch controller for an LED light string or light strip comprises a housing 10, an end cover 20, a printed circuit board 40 and a touch input unit 80, and the disclosure is described in details in conjunction with the following drawings:

As shown in FIG. 1, the housing 10 preferentially adopts the structure that a main body part of the housing 10 is in the shape of a barrel defined by an annular wall, one end of the housing 10 is closed, the other end of the housing 10 is provided with an opening, the housing 10 is made of PC or PVC material through injection molding, the closed end of the housing 10 is provided with inserted pins 90, the inserted pins 90 and the housing 10 are cast into a whole body so that the housing 10 is in liquid-sealed connection with the inserted pins 90, one end of each of the inserted pins 90 extends to the interior of the housing 10 to be electrically connected with the printed circuit board 40, the other ends of the inserted pins 90 are exposed out of the housing 10, and the inserted pins 90 are connected with a socket connected with an alternating-current power supply. Preferably, input plugging sheets are welded at one end of the printed circuit board 40, and after the printed circuit board 40 is inserted into the interior of the housing 10, the input plugging sheets are in plugging fit with the inserted pins 90.

As shown in FIG. 1, after the end cover 20 is connected with the housing 10, a liquid-sealed accommodating cavity 30 is defined between the end cover 20 and the housing 10, namely liquid cannot enter the accommodating cavity 30 through the housing 10 and the end cover 20 and the joint of the housing 10 and the end cover 20, the end cover 20 is in liquid-sealed connection with the housing 10, and the end cover 20 and the housing 10 are welded through ultrasonic waves preferentially. In the embodiment, in order to achieve absolute waterproofness, through holes for installing the touch input unit 80 do not need to be formed in the housing 10 or the end cover 20.

As shown in FIG. 1 and FIG. 2, the printed circuit board 40 is positioned in the accommodating cavity 30, a light-emitting control circuit 60 is arranged on the printed circuit board 40, in the embodiment, a direct-current output circuit 50 is further arranged on the printed circuit board 40, and the direct-current output circuit 50 preferentially adopts a circuit for converting alternating current into direct current. For example, the direct-current output circuit 50 can be composed of a rectification filter circuit and a voltage conversion circuit which are disclosed in CN103561507A, so that the inserted pins 90 are coupled with the alternating-current power supply, alternating current is converted into direct current through the action of the direct-current output circuit 50, and the current required for work is provided for each circuit in the touch controller and the LED light string or light strip. The light-emitting control circuit 60 can be composed of a microcontroller and a bridge type drive circuit which are disclosed in CN103561507A, the microcontroller outputs pulse width modulation signals with different duty ratios, and the LED light string or light strip generates different light-emitting effects under the action of the bridge type drive circuit.

As shown in FIG. 1 and FIG. 2, in the embodiment, a connector 70 is arranged on the end cover 20, the connector 70 is used for connecting the LED light string or light strip, the connector 70 is electrically connected with the output end of the light-emitting control circuit 60 and the direct-current output circuit 50, the connector 70 is composed of a socket and conductive sheets, and the socket, the conductive sheets and the end cover 20 are integrally formed through injection molding, so that the connector 70 is in liquid-sealed connection with the end cover 20. The connector 70 is electrically connected with the printed circuit board 40, preferably, output plugging sheets are welded on the printed circuit board 40, and after the end cover 20 is combined with the housing 10, the conductive sheets in the connector 70 are in plugging connection with the output plugging sheets. In use, a plug of the LED light string or light strip is directly in plugging connection with the connector 70.

As shown in FIG. 1 and FIG. 2, the touch input unit 80 is positioned in the accommodating cavity 30, the touch input unit 80 is electrically connected with the light-emitting control circuit 60, one part of the touch input unit 80 is matched with the housing 10 or the end cover 20, and when a touch behavior is applied to the part, matched with the touch input unit 80, of the housing 10 or the end cover 20, a trigger signal is provided for the light-emitting control circuit 60 through the touch input unit 80.

As shown in FIG. 1 and FIG. 2, preferably, one part of the touch input unit 80 abuts against the housing 10 or the end cover 20, or is fixed to the housing 10 or the end cover 20, or is in clearance fit with the housing 10 or the end cover 20. The other part of the touch input unit 80 is arranged on the printed circuit board 40.

As shown in FIG. 1 and FIG. 2, the touch input unit 80 comprises a touch conduction part 801, a touch detection unit 802 and a touch control unit 803, and the touch conduction part 801 is matched with the housing 10 or the end cover 20. The touch conduction part 801 adopts a spring preferentially, after the housing 10 is connected with the end cover 20, the spring is compressed by the end cover 20 so that the spring abuts against the end cover 20, and the spring is welded and fixed with the printed circuit board 40.

As shown in FIG. 1 and FIG. 2, an installation part 100 matched with the touch input unit 80 is arranged on the inner wall surface of the housing 10 or the end cover 20, a touch identification part 101 for touching is arranged on the outer wall surface of the housing 10 or the end cover 20, the position of the touch identification part 101 corresponds to that of the installation part 100, and the touch behavior can be applied conveniently through the touch identification part 101.

As shown in FIG. 1 and FIG. 2, in the embodiment, the installation part 100 is preferentially an inner recess formed by recessing along the inner wall surface of the housing 10 or the end cover 20, the touch conduction part 801 abuts against the surface of the installation part 100, and the touch identification part 101 is preferentially an outer recess formed by recessing along the outer wall surface of the housing 10 or the end cover 20.

As shown in FIG. 1 and FIG. 2, the touch detection unit 802 is electrically connected with the touch conduction part 801, when the touch behavior is applied to the part, matched with the touch conduction part 801, of the housing 10 or the end cover 20, the touch detection unit 802 generates the change of electrical parameters through the conduction of the touch conduction part 801, the touch control unit 803 is electrically connected with the touch detection unit 802, and when the touch control unit 803 judges that the touch behavior is effective according to the electrical parameters provided by the touch detection unit 802, the touch control unit 803 generates and outputs the trigger signal.

Figure 3:
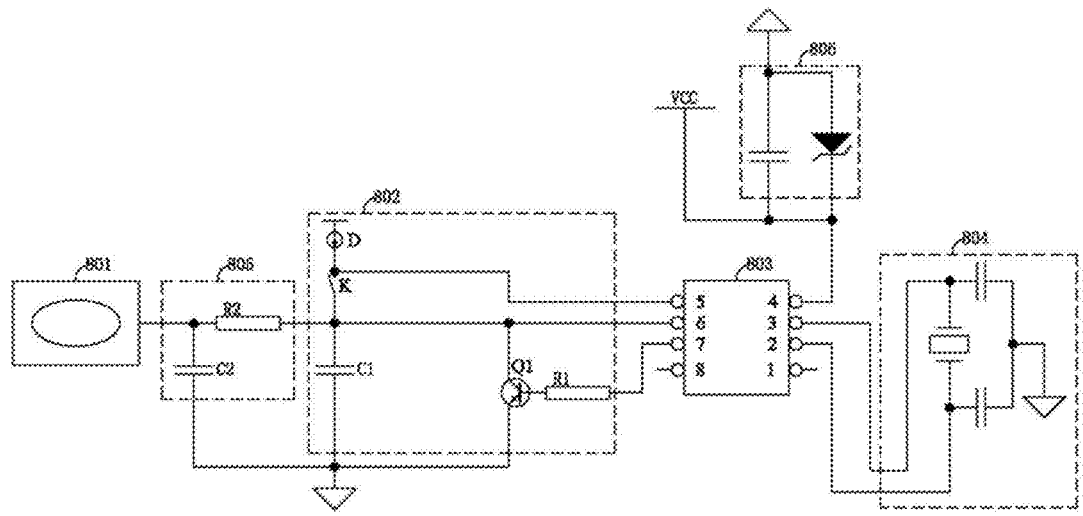
FIG. 3 is a schematic circuit diagram of the touch input unit.

As shown in FIG. 3, the change of the electrical parameters preferentially adopts the change of oscillation frequency caused by the change of capacitance value, preferably, the touch detection unit 802 comprises a first capacitor C1, a first switch Q1, a first resistor R1, a second switch K and a constant current source D, the first capacitor C1 is connected with the touch control unit 803, the other end of the first capacitor C1 is grounded, the first switch Q1 is a triode, a collector of the first switch Q1 is connected with the touch control unit 803, an emitter of the first switch Q1 is connected with the ground, a base of the first switch Q1 is connected with the touch control unit 803 through the first resistor R1, and the second switch K is connected with the first capacitor C1, the touch control unit 803 and the constant current source D respectively.

After the touch control unit 803 controls the first switch K to be switched on, the constant current source D charges the first capacitor C1, the touch control unit 803 detects a voltage on the first capacitor C1, and when a set threshold value is reached, the touch control unit 803 outputs a high level to enable the first switch Q1 to discharge the first capacitor C1, and charging and discharging are carried out in this way to form oscillation frequency.

As shown in FIG. 3, reference frequency is set in the touch control unit 803. When no touch behavior occurs, the frequency input into the touch control unit 803 is within a specified range, or the frequency of an input signal is slightly changed under the action of an external interference signal, the touch control unit 803 calculates the frequency of the input signal and the reference frequency, the value of the reference frequency can be a range value, and if the frequency of the input signal is smaller than the minimum value of the reference frequency, it is indicated that the input signal is not an effective touch signal.

As shown in FIG. 3, when an operator applies the touch behavior to the part, matched with the touch input unit 80, of the housing 10 or the end cover 20, the touch conduction part 801 forms capacitance through a finger of the operator, at the moment, the total capacitance value is changed, and then the oscillation frequency of a signal input into the touch control unit 803 is changed, the touch control unit 803 calculates the frequency of the input signal and the reference frequency, if the frequency of the input signal is greater than the maximum value of the reference frequency, it is indicated that the input signal is an effective touch signal, therefore, the touch control unit 803 generates and outputs the trigger signal which is preferably a pulse signal, and the light-emitting control circuit 60 outputs the pulse width modulation signals with changed effects according to the pulse signal.

As shown in FIG. 3, the touch input unit 80 further comprises a reference adjustment unit 805 for adjusting and comparing the signal reference of the electrical parameters, and the reference adjustment unit 805 is electrically connected with the touch conduction part 801 and the touch detection unit 802. The reference adjustment unit 805 comprises a second capacitor C2 and a second resistor R2, one end of the second capacitor C2 is connected with the touch conduction part 801, the other end of the second capacitor C2 is grounded, one end of the second resistor R2 is connected with the touch conduction part 801, the other end of the second resistor R2 is electrically connected with the touch detection unit 802, and the reference electrical parameters of the touch control unit 803, such as the frequency of the signals, input into the touch control unit 803 can be changed through the second capacitor C2 and the second resistor R2.

As shown in FIG. 3, the touch input unit 80 further comprises a voltage stabilizing unit 806 for providing a stabilized voltage for the touch control unit 803. The voltage stabilizing unit 806 is electrically connected with the touch control unit 803, and the voltage stabilizing unit 806 is composed of a voltage stabilizing diode and a capacitor in parallel.

As shown in FIG. 2 and FIG. 3, the touch input unit 80 further comprises a timing unit 804 for calculating the duration of the touch behavior, and the timing unit 804 is electrically connected with the touch control unit 803. The duration of the touch behavior is calculated by the timing unit 804, and when the touch behavior occurs continuously, for example, for more than 10 seconds, the touch control unit 803 can output a corresponding control signal voluntarily, for example, a power-on initial state is returned back. The situation is mainly aimed at misoperation, such as the change of the electrical parameters caused by the fact that the touch identification part 101 is covered with an object with a non-touch behavior, through the arrangement, a user is likely to find that the light-emitting effect of an LED lamp needs to be inconsistent with the light-emitting effect of a current LED lamp, and then the touch controller is checked so as to remove the object with which the touch identification part 101 is covered.

Figure 4:
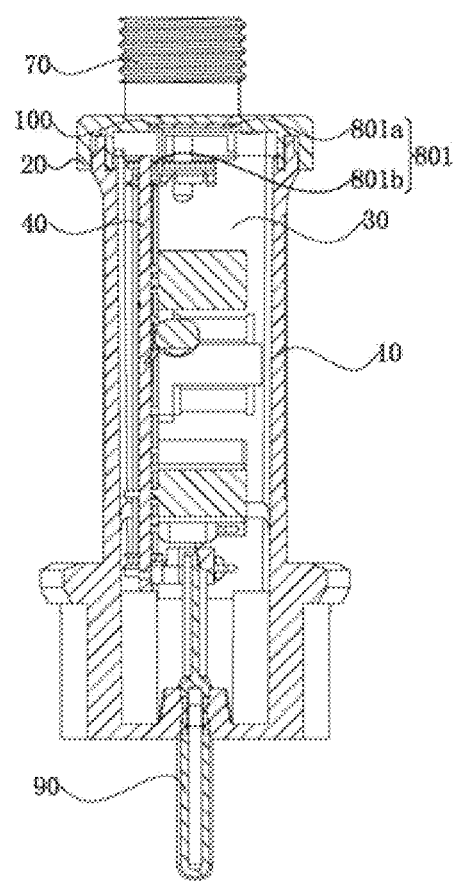
FIG. 4 is a profile of another touch controller.
Figure 4A:
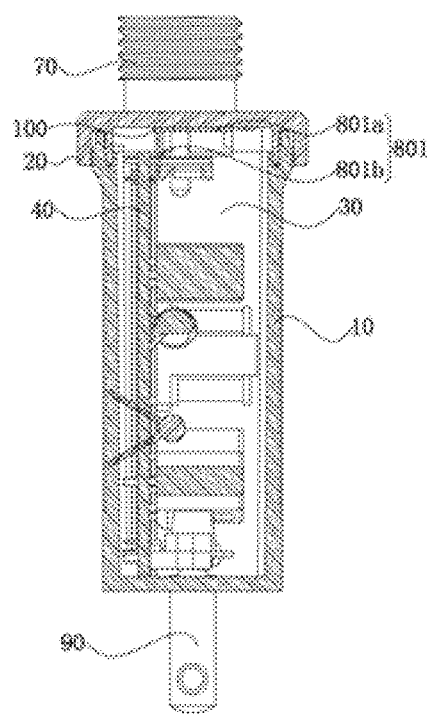
FIG. 4a is a profile of another touch controller.
Figure 5A:
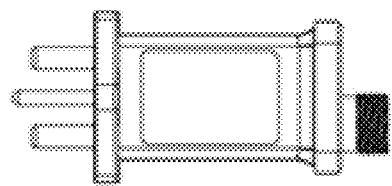
FIG. 5a to FIG. 5g are external views of a first touch controller.
Figure 5B:
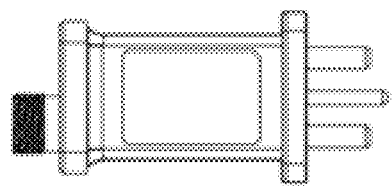
Figure 5C:
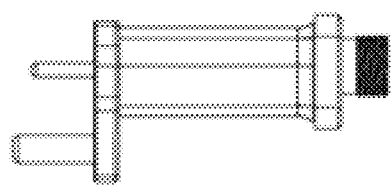
Figure 5D:
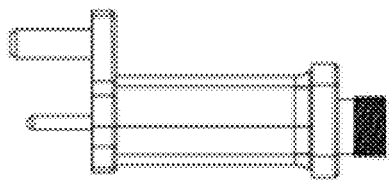
Figure 5E:
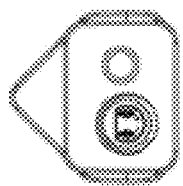
Figure 5F:
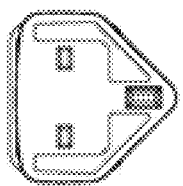
Figure 5G:
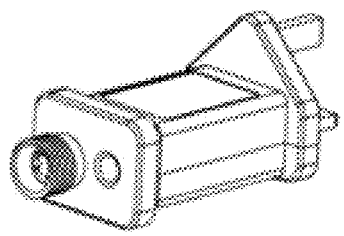
Figure 6A:
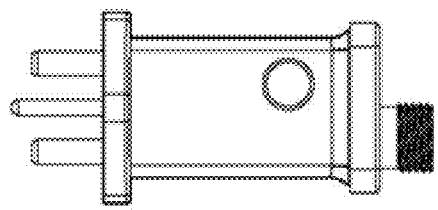
FIG. 6a to FIG. 6g are external views of a second touch controller.
Figure 6B:
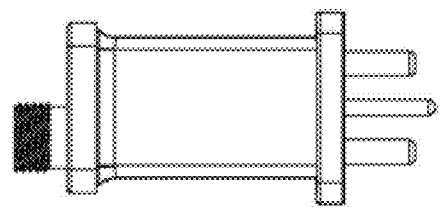
Figure 6C:
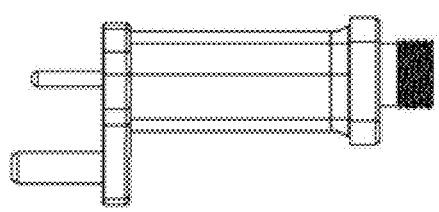
Figure 6D:
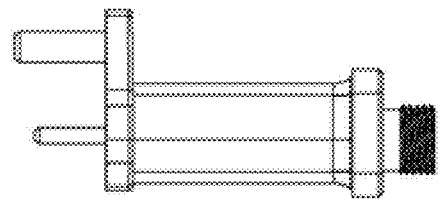
Figure 6E:
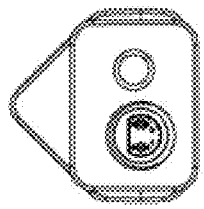
Figure 6F:
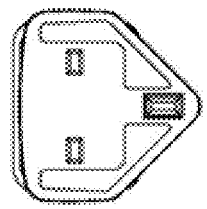
Figure 6G:
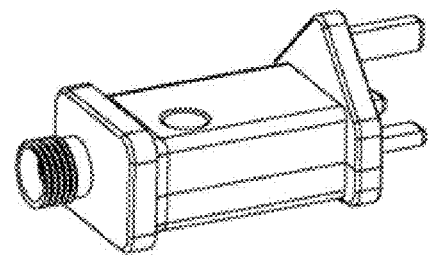
Figure 7A:
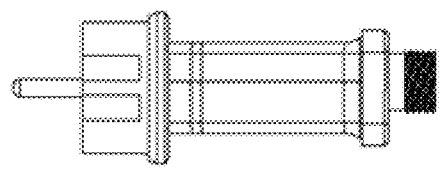
FIG. 7a to FIG. 7g are external views of a third touch controller.
Figure 7B:
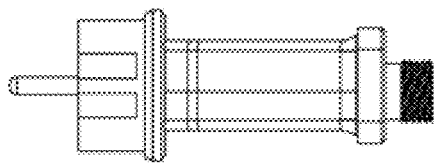
Figure 7C:
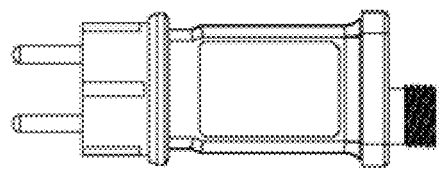
Figure 7D:
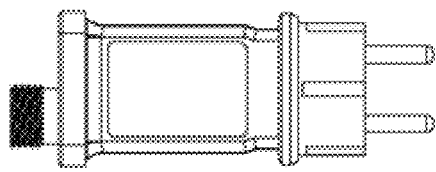
Figure 7E:
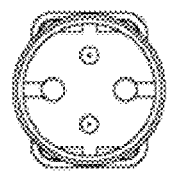
Figure 7F:
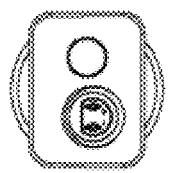
Figure 7G:
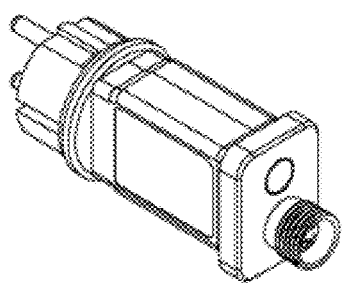
Figure 8A:
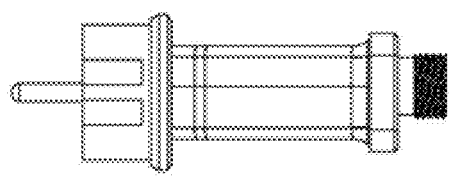
FIG. 8a to FIG. 8g are external views of a fourth touch controller.
Figure 8B:
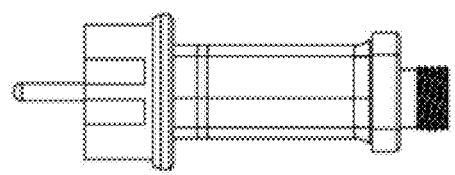
Figure 8C:
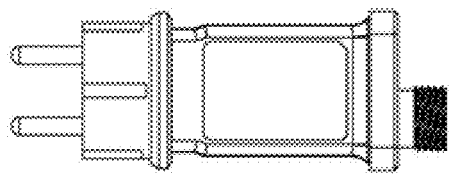
Figure 8D:
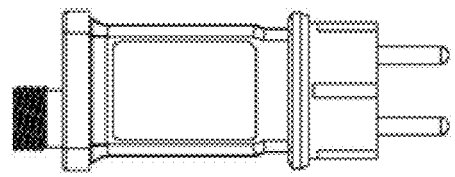
Figure 8E:
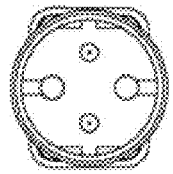
Figure 8F:
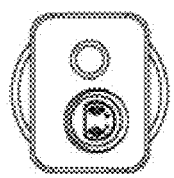
Figure 8G:
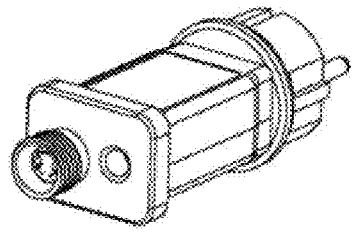
Figure 9A:
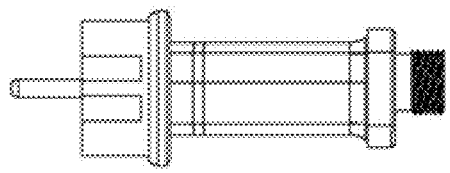
FIG. 9a to FIG. 9g are external views of a fifth touch controller.
Figure 9B:
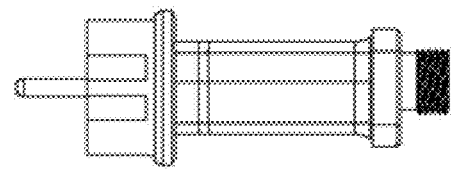
Figure 9C:
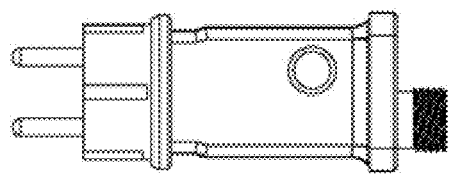
Figure 9D:
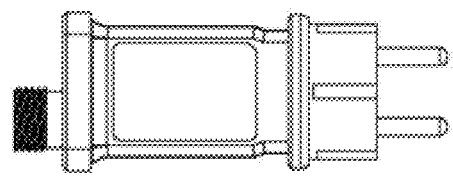
Figure 9E:
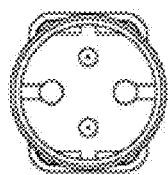
Figure 9F:
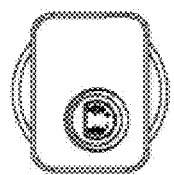
Figure 9G:
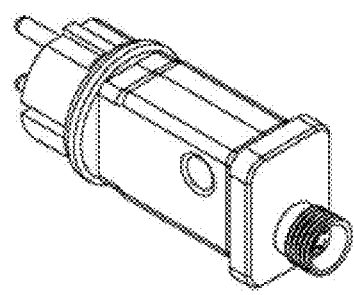
Figure 10A:
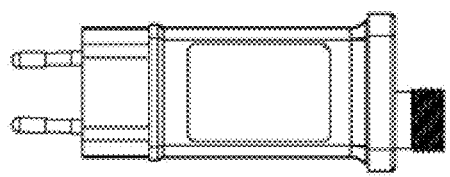
FIG. 10a to FIG. 10g are external views of a sixth touch controller.
Figure 10B:
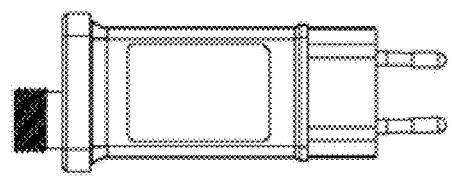
Figure 10C:
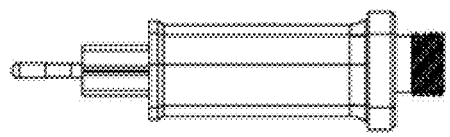
Figure 10D:
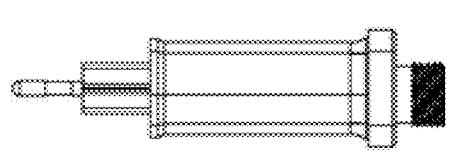
Figure 10E:
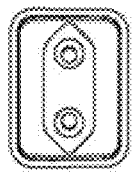
Figure 10F:
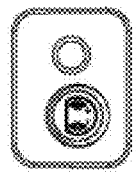
Figure 10G:
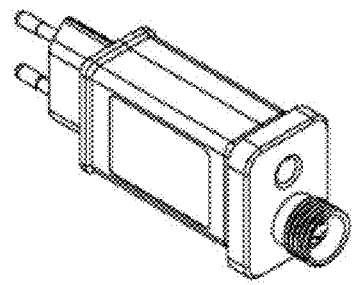
Figure 11A:
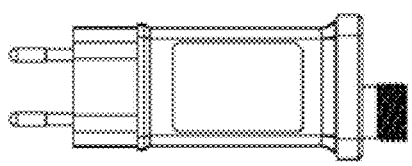
FIG. 11a to FIG. 11g are external views of a seventh touch controller.
Figure 11B:
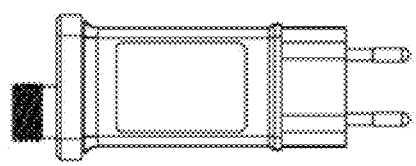
Figure 11C:
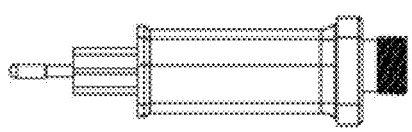
Figure 11D:
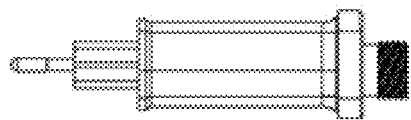
Figure 11E:
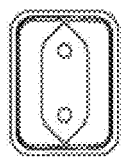
Figure 11F:
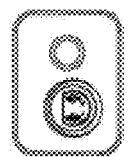
Figure 11G:
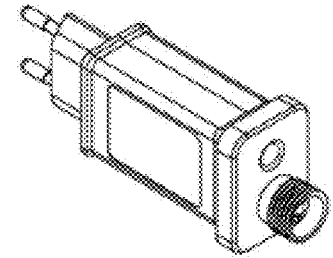
Figure 12A:
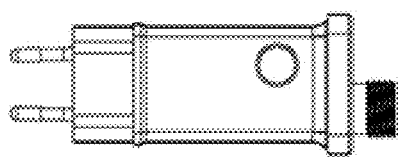
FIG. 12a to FIG. 12g are external views of an eighth touch controller.
Figure 12B:
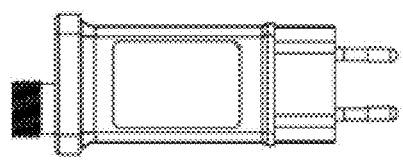
Figure 12C:
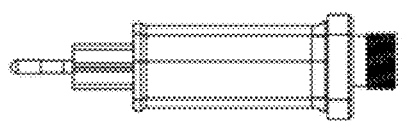
Figure 12D:
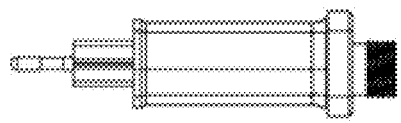
Figure 12E:
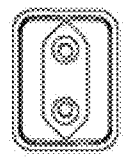
Figure 12F:
Figure 12G:
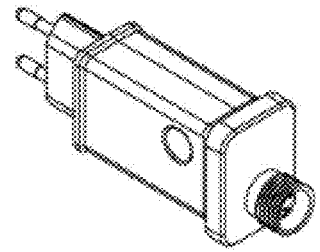
Figure 13A:
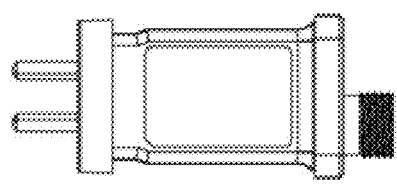
FIG. 13a to FIG. 13g are external views of a ninth touch controller.
Figure 13B:
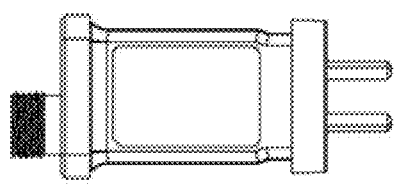
Figure 13C:
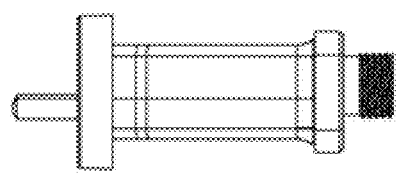
Figure 13D:
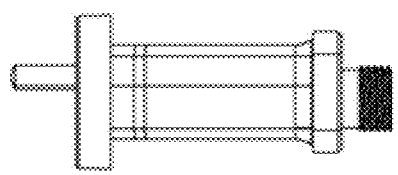
Figure 13E:
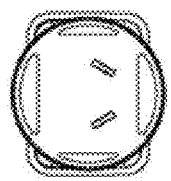
Figure 13F:
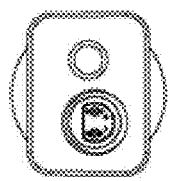
Figure 13G:
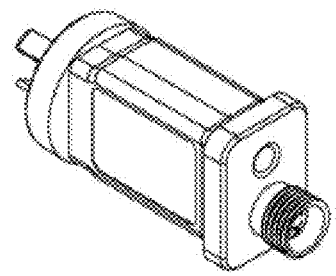
Figure 14A:
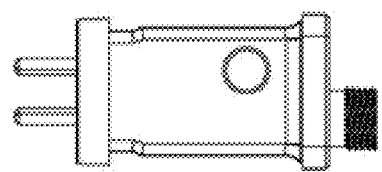
FIG. 14a to FIG. 14g are external views of a tenth touch controller.
Figure 14B:
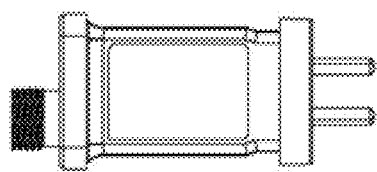
Figure 14C:
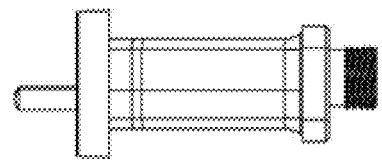
Figure 14D:
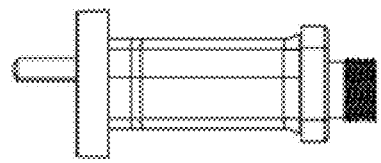
Figure 14E:
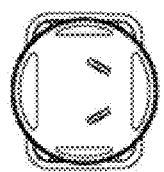
Figure 14F:
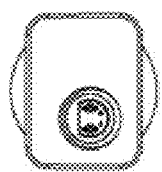
Figure 14G:
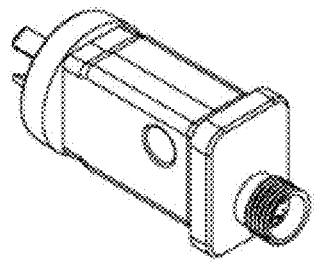
Figure 15A:
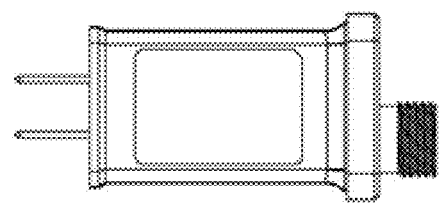
FIG. 15a to FIG. 15g are external views of an eleventh touch controller.
Figure 15B:
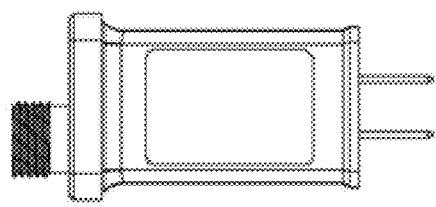
Figure 15C:
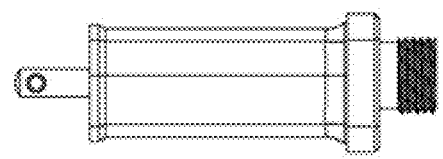
Figure 15D:
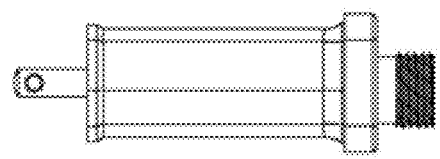
Figure 15E:
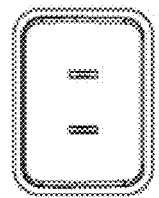
Figure 15F:
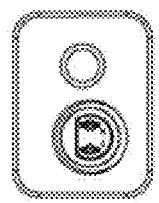
Figure 15G:
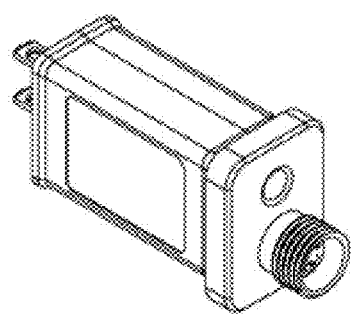
Figure 16A:
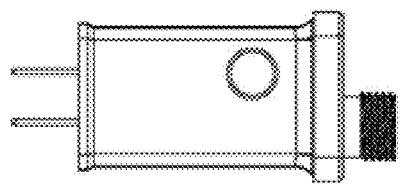
FIG. 16a to FIG. 16g are external views of a twelfth touch controller.
Figure 16B:
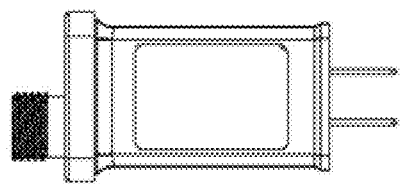
Figure 16C:
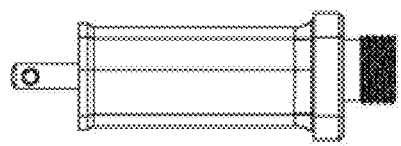
Figure 16D:
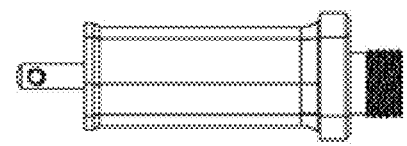
Figure 16E:
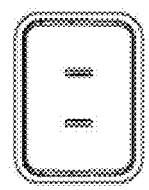
Figure 16F:
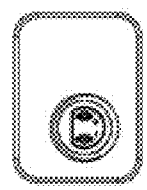
Figure 16G:
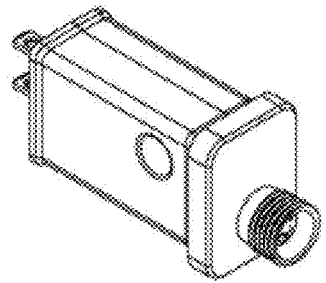
Figure 17A:
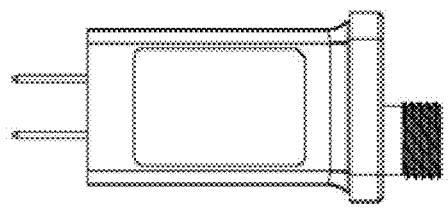
FIG. 17a to FIG. 17g are external views of a thirteenth touch controller.
Figure 17B:
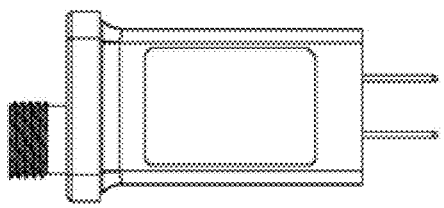
Figure 17C:
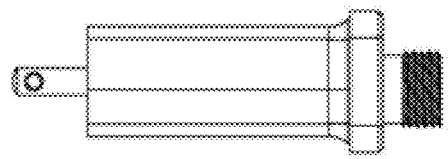
Figure 17D:
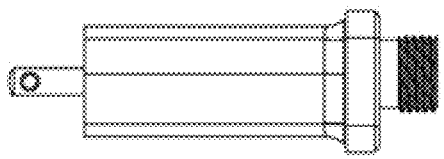
Figure 17E:
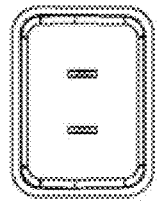
Figure 17F:
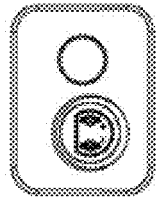
Figure 17G:
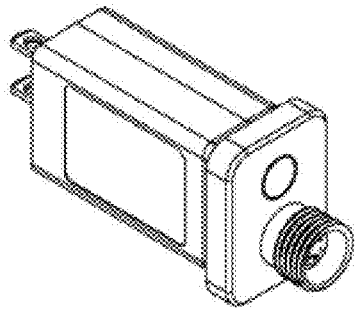
Figure 18A:
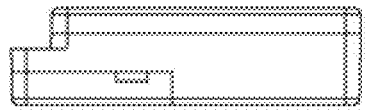
FIG. 18a to FIG. 18g are external views of a fourteenth touch controller.
Figure 18B:
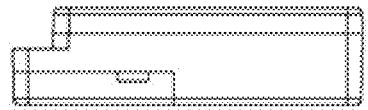
Figure 18C:
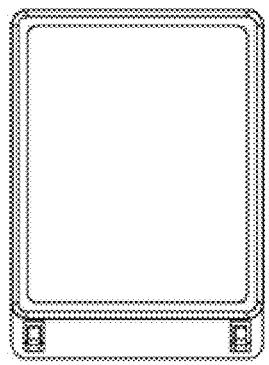
Figure 18D:
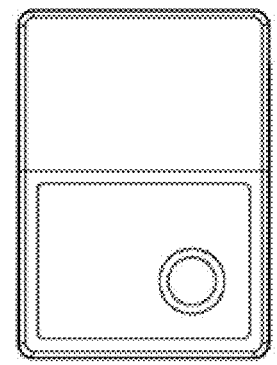
Figure 18E:
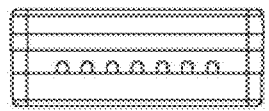
Figure 18F:
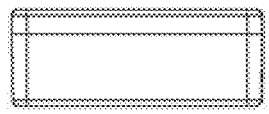
Figure 18G:
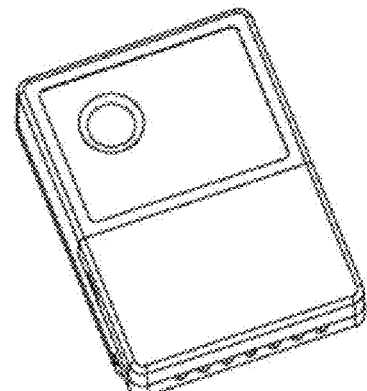
Figure 19A:
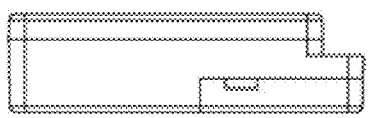
FIG. 19a to FIG. 19g are external views of a fifteenth touch controller.
Figure 19B:
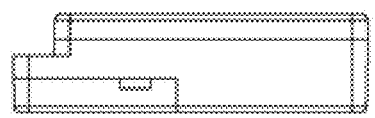
Figure 19C:
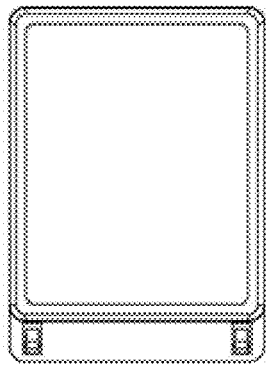
Figure 19D:
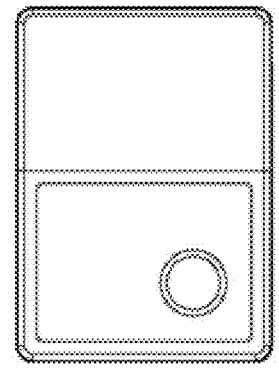
Figure 19E:
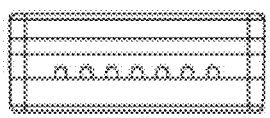
Figure 19F:
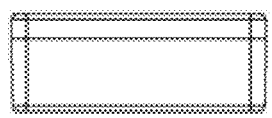
Figure 19G:
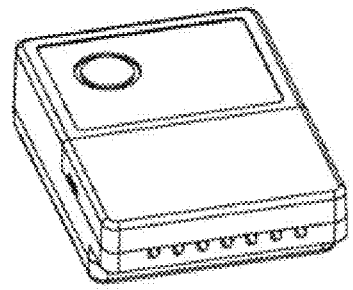
Figure 20A:
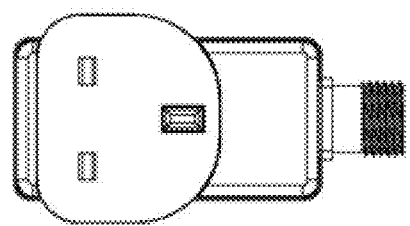
FIG. 20a to FIG. 20g are external views of a sixteenth touch controller.
Figure 20B:
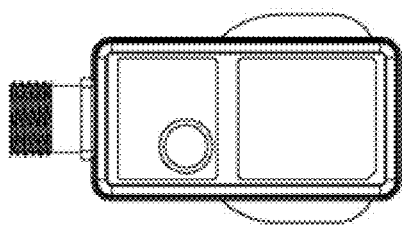
Figure 20C:
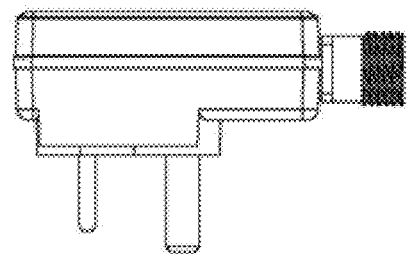
Figure 20D:
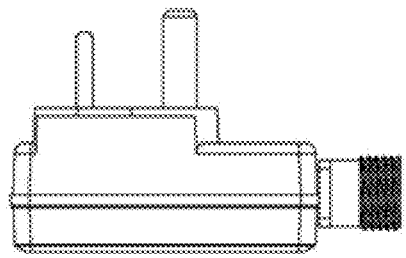
Figure 20E:
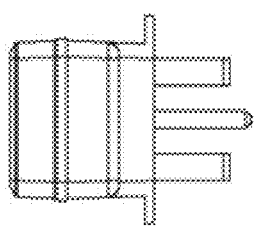
Figure 20F:
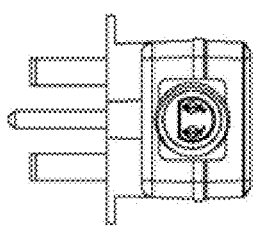
Figure 20G:
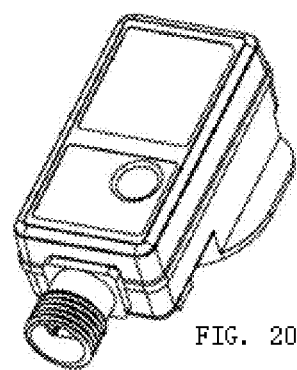
Figure 21A:
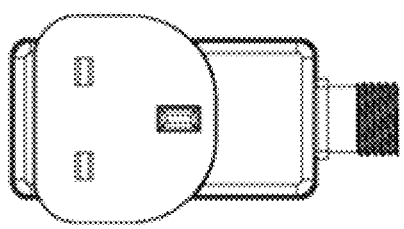
FIG. 21a to FIG. 21g are external views of a seventeenth touch controller.
Figure 21B:
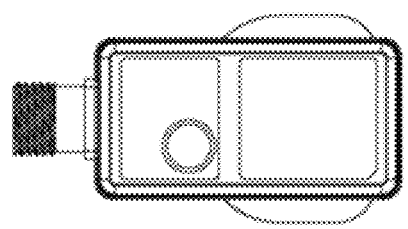
Figure 21C:
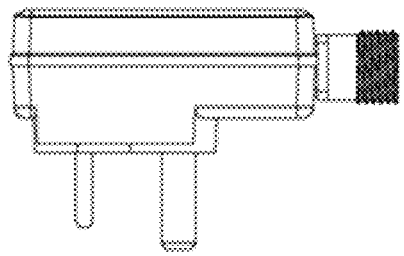
Figure 21D:
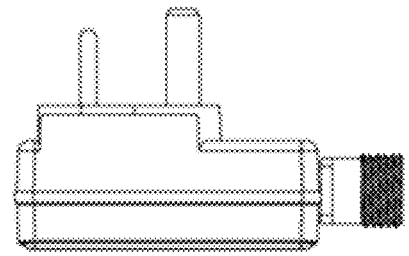
Figure 21E:
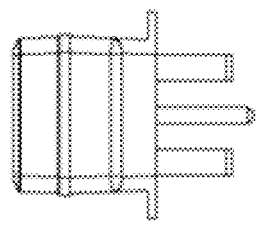
Figure 21F:
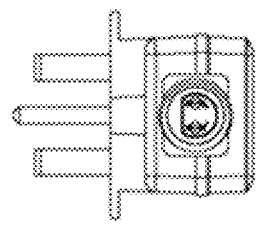
Figure 21G:
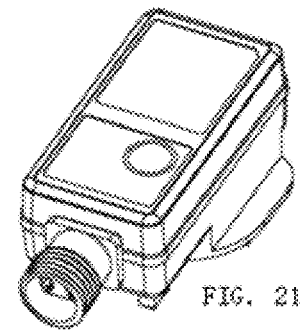
Figure 22A:
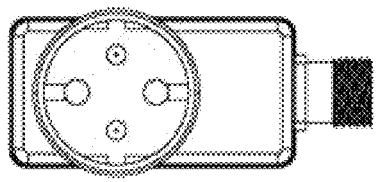
FIG. 22a to FIG. 22g are external views of an eighteenth touch controller.
Figure 22B:
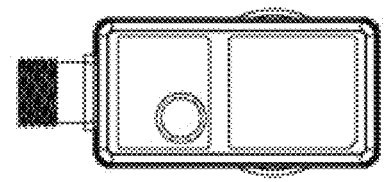
Figure 22C:
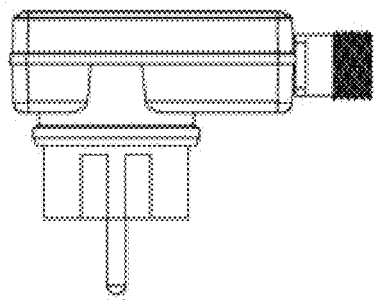
Figure 22D:
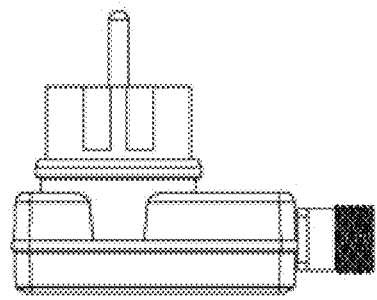
Figure 22E:
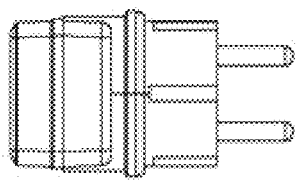
Figure 22F:
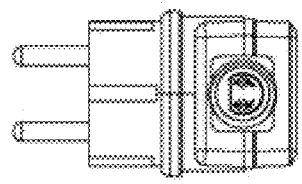
Figure 22G:
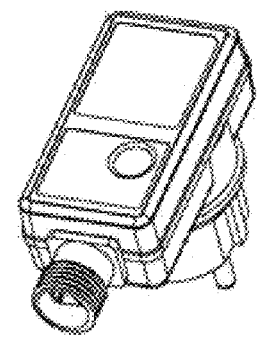
Figure 23A:
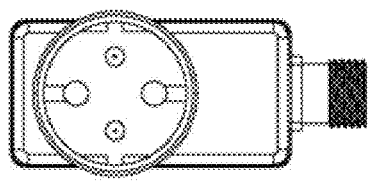
FIG. 23a to FIG. 23g are external views of an nineteenth touch controller.
Figure 23B:
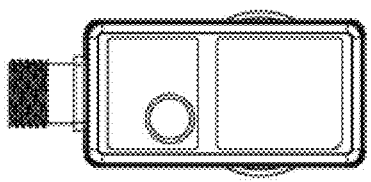
Figure 23C:
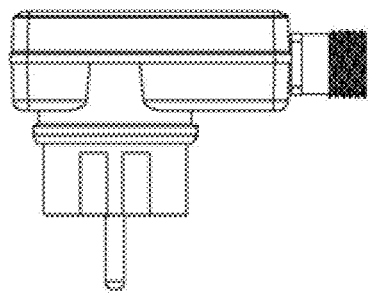
Figure 23D:
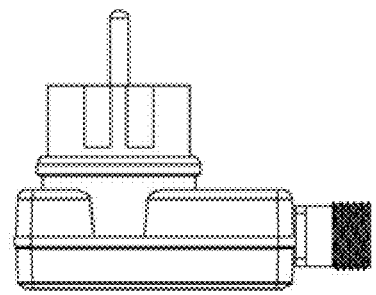
Figure 23E:
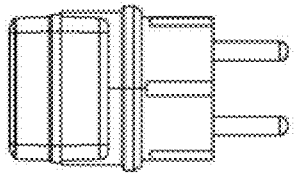
Figure 23F:
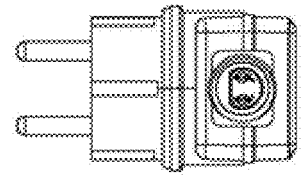
Figure 23G:
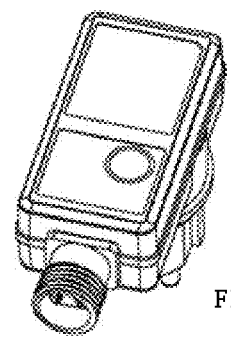
Figure 24A:
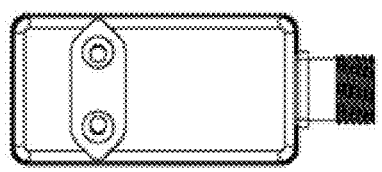
FIG. 24a to FIG. 24g are external views of a twentieth touch controller.
Figure 24B:
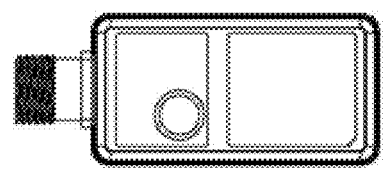
Figure 24C:
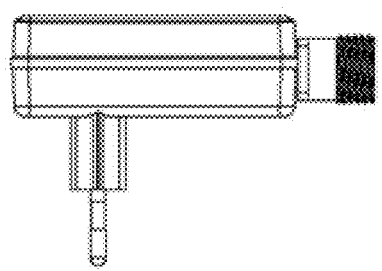
Figure 24D:
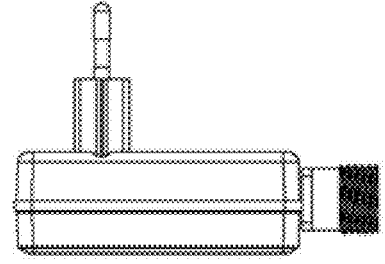
Figure 24E:
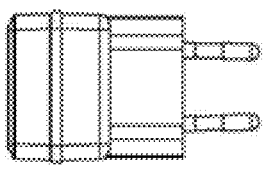
Figure 24F:
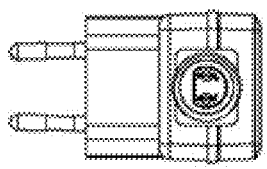
Figure 24G:
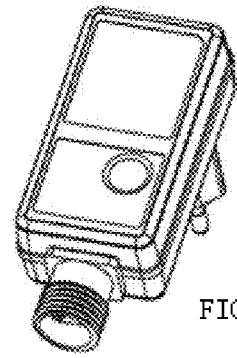
Figure 25A:
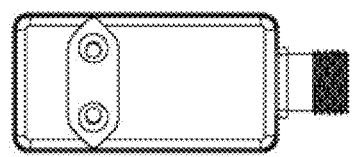
FIG. 25a to FIG. 25g are external views of a twenty-first touch controller.
Figure 25B:
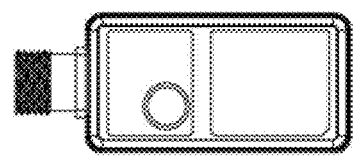
Figure 25C:
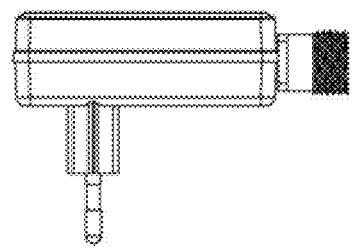
Figure 25D:
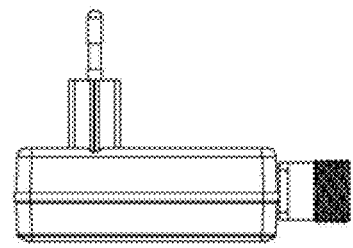
Figures 25E, 25F:
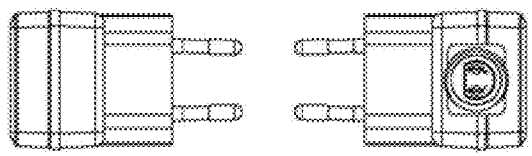
Figure 25G:
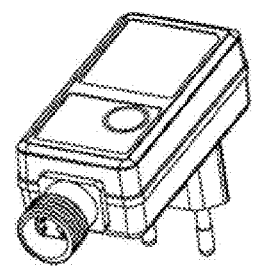
Figure 26A:
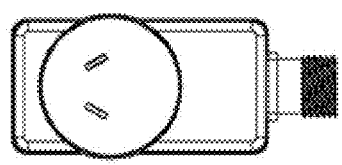
FIG. 26a to FIG. 26g are external views of a twenty-second touch controller.
Figure 26B:
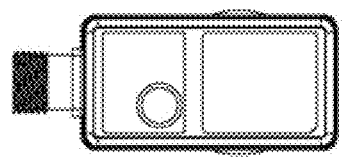
Figure 26C:
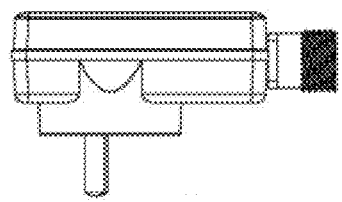
Figure 26D:
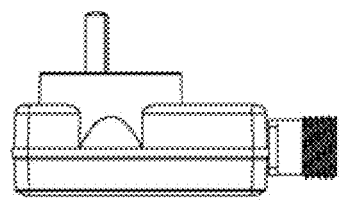
Figure 26E:
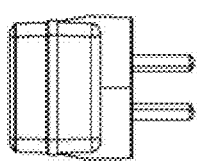
Figure 26F:
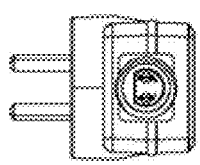
Figure 26G:
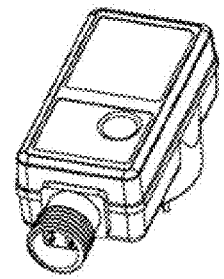
Figure 27A:
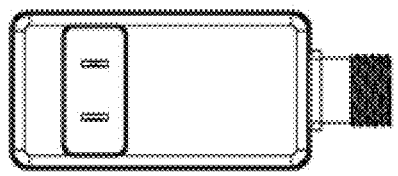
FIG. 27a to FIG. 27g are external views of a twenty-third touch controller.
Figure 27B:
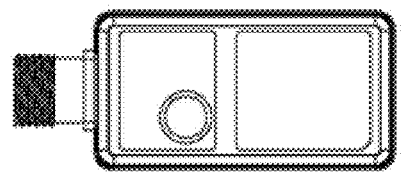
Figure 27C:
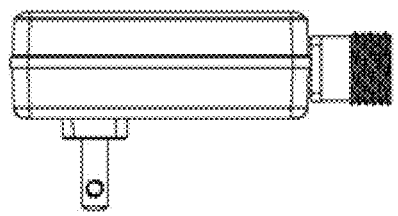
Figure 27D:
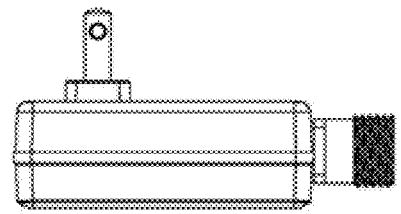
Figure 27E:
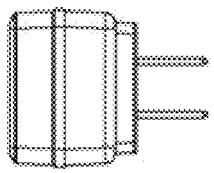
Figure 27F:
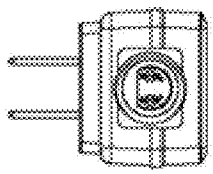
Figure 27G:
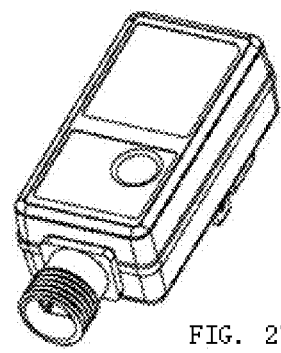
Figure 28A:
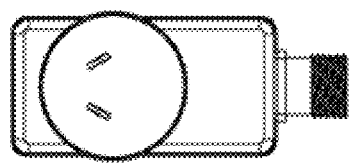
FIG. 28a to FIG. 28g are external views of a twenty-fourth touch controller.
Figure 28B:
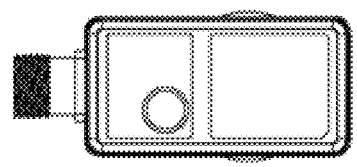
Figure 28C:
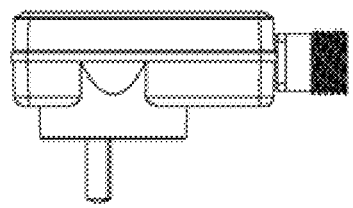
Figure 28D:
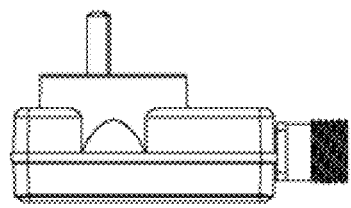
Figure 28E:
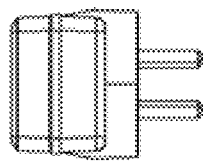
Figure 28F:
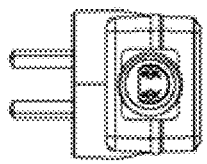
Figure 28G:
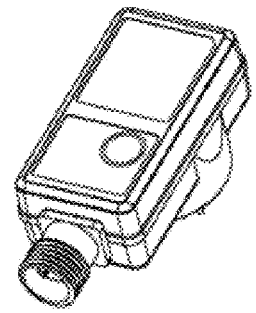
Figure 29A:
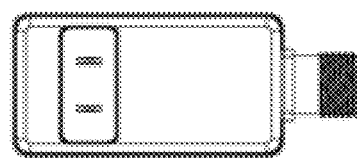
FIG. 29a to FIG. 29g are external views of a twenty-fifth touch controller.
Figure 29B:
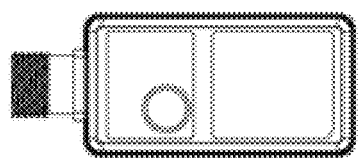
Figure 29C:
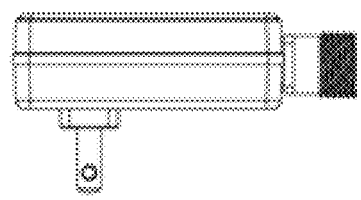
Figure 29D:
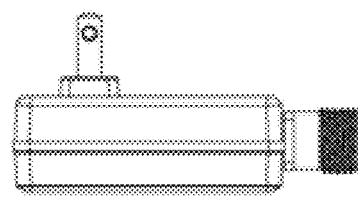
Figure 29E:
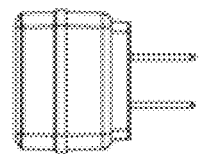
Figure 29F:
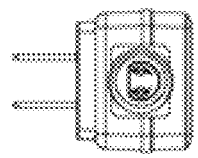
Figure 29G:
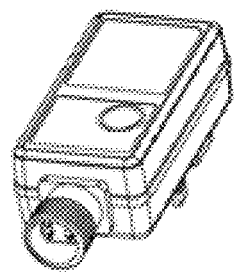

The disclosure is not limited to the embodiment, for example, (a), as shown in FIG. 4, the touch conduction part 801 comprises a conductive sheet 801a and a conductive pin 801b, the conductive sheet 801a is matched with the housing 10 or the end cover 20, one end of the conductive pin 801b is connected with the conductive sheet 801a, and the other end of the conductive pin 801b is connected with the touch detection unit 802;

The installation part 100 comprises an inner recess formed by recessing along the inner wall surface of the housing 10 or the end cover 20, the conductive sheet 801a is preferentially bonded with the housing 10 or the end cover 20, the touch identification part 101 comprises an annular groove formed in the outer surface of the housing 10 or the end cover 20, preferably, a plastic or rubber nest is embedded in the annular groove, and the color of the plastic or rubber nest is different from that of the housing 10 or the end cover 20;

The installation part 100 and the touch identification part 101 may also be such configured that the touch identification part 101 adopts the structure described in (a), and the installation part 100 is a region on the inner wall surface of the housing 10 or the end cover 20;

(b), the installation part 100 is a cylinder or a cone, the touch conduction part 801 (spring) sleeves the cylinder or the cone, a gap is reserved between the touch conduction part 801 and the inner wall surface of the housing 10 or the end cover 20, the size of the gap is 0.5-1 mm, and the touch identification part 101 can be a protruding part or a label different from the housing 10 or the end cover 20 in other colors;

(c), the installation part 100 is not arranged on the inner wall surface of the housing 10 or the end cover 20, the touch conduction part 801 abuts against the inner wall surface of the housing 10 or the end cover 20, the touch identification part 101 is arranged on the outer wall surface of the housing 10 or the end cover 20, and the touch identification part 101 corresponds to the position where the touch conduction part 801 abuts against the inner wall surface of the housing 10 or the end cover 20;

(d), the number of the touch input units 80 can be two or more, for example, when the number of the touch input units 80 is two, one of the touch input units 80 outputs a trigger signal for changing a flashing mode, and the other touch input unit 80 outputs a trigger signal for changing lighting intensity;

(e) when the number of the touch input unit 80 is one, wherein two or more than two sets of touch conduction parts 801 and two or more than two sets of touch detection units 802 are arranged, for example, when the two or more than two sets of touch conduction parts 801 and the two or more than two sets of touch detection units 802 are arranged, one set of touch conduction parts 801 or one set of touch detection units 802 is used for enabling the touch control unit 803 to output the trigger signal for changing the flashing mode, and the other set of touch conduction parts or the other set of touch detection units is used for enabling the touch control unit 803 to output the trigger signal for changing lighting intensity; and and (f), as shown in FIG. 18a to FIG. 18g, compared with the structure of the touch controller as shown in FIG. 1, the structure is not provided with a plug sheet 90 or a connector 70, the touch controller further can be powered by a direct-current power supply, such as an external direct-current stabilized power supply or a storage battery, the direct-current power supply is connected with the light-emitting control circuit 60 on the printed circuit board 40 through a wire so as to be used for the LED light string or the LED light strip, and the wire and the housing 10 can be subjected to waterproof treatment by heating a melt adhesive.

What is claimed is:

1. A touch controller for an LED light string or light strip, comprising:
    a housing;
    an end cover, after the end cover is connected with the housing, a liquid-sealed accommodating cavity being defined between the end cover and the housing;
    a printed circuit board positioned in the accommodating cavity, a light-emitting control circuit being arranged on the printed circuit board; and
    characterized by further comprising a touch input unit positioned in the accommodating cavity, the touch input unit being electrically connected with the light-emitting control circuit, one part of the touch input unit being matched with the housing or the end cover, and when a touch behavior is applied to the part, matched with the touch input unit, of the housing or the end cover, a trigger signal is provided for the light-emitting control circuit through the touch input unit.

2. The touch controller according to claim 1, characterized in that the other part of the touch input unit is arranged on the printed circuit board and electrically connected with the light-emitting control circuit.

3. The touch controller according to claim 2, characterized in that the touch input unit comprises:
    a touch conduction part matched with the housing or the end cover;
    a touch detection unit electrically connected with the touch conduction part, when the touch behavior is applied to the part, matched with the touch conduction part, of the housing or the end cover, the touch detection unit generating the change of electrical parameters through the conduction of the touch conduction part; and
    a touch control unit electrically connected with the touch detection unit, when the touch control unit judges that the touch behavior is effective according to the electrical parameters provided by the touch detection unit, the touch control unit generating and outputting the trigger signal.

4. The touch controller according to claim 3, characterized in that the touch input unit further comprises a reference adjustment unit for adjusting and comparing the signal reference of the electrical parameters, and the reference adjustment unit is electrically connected with the touch conduction part and the touch detection unit.

5. The touch controller according to claim 3, characterized in that the touch input unit further comprises a voltage stabilizing unit for providing a stabilized voltage for the touch control unit.

6. The touch controller according to claim 3, characterized in that the touch input unit further comprises a timing unit for calculating the duration of the touch behavior, and the timing unit is electrically connected with the touch control unit.

7. The touch controller according to claim 3, characterized in that an installation part matched with the touch input unit is arranged on the inner wall surface of the housing or the end cover, a touch identification part is arranged on the outer wall surface of the housing or the end cover, and the position of the touch identification part corresponds to that of the installation part.

8. The touch controller according to claim 3, characterized in that the touch conduction part is a spring, and after the housing is connected with the end cover, the spring is compressed by the end cover so that the spring abuts against the end cover.

9. The touch controller according to claim 3, characterized in that the touch conduction part comprises a conductive sheet and a conductive pin, the conductive sheet is matched with the housing or the end cover, one end of the conductive pin is connected with the conductive sheet, and the other end of the conductive pin is connected with the touch detection unit.

10. The touch controller of an LED light string or light strip according to claim 1, characterized in that one part of the touch input unit abuts against the housing or the end cover, or is fixed to the housing or the end cover, or is in clearance fit with the housing or the end cover.

11. The touch controller according to claim 1, characterized in that the touch input unit comprises:
    a touch conduction part matched with the housing or the end cover;
    a touch detection unit electrically connected with the touch conduction part, when the touch behavior is applied to the part, matched with the touch conduction part, of the housing or the end cover, the touch detection unit generating the change of electrical parameters through the conduction of the touch conduction part; and a touch control unit electrically connected with the touch detection unit, when the touch control unit judges that the touch behavior is effective according to the electrical parameters provided by the touch detection unit, the touch control unit generating and outputting the trigger signal.

12. The touch controller according to claim 11, characterized in that the touch input unit further comprises a reference adjustment unit for adjusting and comparing the signal reference of the electrical parameters, and the reference adjustment unit is electrically connected with the touch conduction part and the touch detection unit.

13. The touch controller according to claim 11, characterized in that the touch input unit further comprises a voltage stabilizing unit for providing a stabilized voltage for the touch control unit.

14. The touch controller according to claim 11, characterized in that the touch input unit further comprises a timing unit for calculating the duration of the touch behavior, and the timing unit is electrically connected with the touch control unit.

15. The touch controller according to claim 11, characterized in that an installation part matched with the touch input unit is arranged on the inner wall surface of the housing or the end cover, a touch identification part is arranged on the outer wall surface of the housing or the end cover, and the position of the touch identification part corresponds to that of the installation part.

16. The touch controller according to claim 11, characterized in that the touch conduction part is a spring, and after the housing is connected with the end cover, the spring is compressed by the end cover so that the spring abuts against the end cover.

17. The touch controller according to claim 11, characterized in that the touch conduction part comprises a conductive sheet and a conductive pin, the conductive sheet is matched with the housing or the end cover, one end of the conductive pin is connected with the conductive sheet, and the other end of the conductive pin is connected with the touch detection unit.

* * * * *